(12) United States Patent
Wu et al.

(10) Patent No.: US 10,145,889 B2
(45) Date of Patent: Dec. 4, 2018

(54) TESTKEY STRUCTURE AND METHOD OF MEASURING DEVICE DEFECT OR CONNECTION DEFECT BY USING THE SAME

(71) Applicant: UNITED MICROELECTRONICS CORP., Hsin-Chu (TW)

(72) Inventors: Kuei-Sheng Wu, Miaoli County (TW); Wen-Jung Liao, Hsinchu (TW); Wen-Shan Hsiao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/480,388

(22) Filed: Apr. 6, 2017

(65) Prior Publication Data

US 2018/0292449 A1    Oct. 11, 2018

(51) Int. Cl.
*G01R 31/26* (2014.01)

(52) U.S. Cl.
CPC ..... *G01R 31/2601* (2013.01); *G01R 31/2621* (2013.01)

(58) Field of Classification Search
CPC ............ G01R 31/2621; G01R 31/2831; G01R 31/2884; G01R 31/2889; H01L 22/14; H01L 22/32; H01L 22/34; H01L 27/088; G06F 17/5081
See application file for complete search history.

(56) References Cited

U.S. PATENT DOCUMENTS

| | | | | |
|---|---|---|---|---|
| 6,456,104 B1* | 9/2002 | Guarin | ............... | G01R 31/2621 324/750.07 |
| 6,707,064 B2* | 3/2004 | Jang | ........................ | H01L 22/34 257/48 |
| 9,024,407 B2* | 5/2015 | Huang | .................... | H01L 23/58 257/503 |

* cited by examiner

*Primary Examiner* — Minh N Tang
(74) *Attorney, Agent, or Firm* — Winston Hsu (57) ABSTRACT

A testkey structure including the following components is provided. A fin structure is disposed on a substrate and stretches along a first direction. A first gate structure and a second gate structure are disposed on the fin structure and stretch along a second direction. A first common source region is disposed in the fin structure between the first gate structure and the second gate structure. A first drain region is disposed in the fin structure at a side of the first gate structure opposite to the first common source region. A second drain region disposed in the fin structure at a side of the second gate structure opposite to the first common source region. A testkey structure is symmetrical along a horizontal line crossing the first common source region. The present invention further provides a method of measuring device defect or connection defect by using the same.

19 Claims, 8 Drawing Sheets

TESTKEY STRUCTURE AND METHOD OF MEASURING DEVICE DEFECT OR CONNECTION DEFECT BY USING THE SAME

BACKGROUND OF THE INVENTION

1. Field of the Invention

The present invention relates to a testkey structure and a method of using the same to measure device defect or connection defect.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (FinFET) have been developed, which includes a three-dimensional channel structure. The manufacturing processes of FinFET devices can be integrated into traditional logic device processes, and thus are more compatible. In addition, since the three-dimensional structure of the FinFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the FinFETs is still aiming to devices with smaller scales.

However, many problem would raise because the shrinkage of the FinFETs size. For example, measuring a resistance value of a FinFET would become more difficult because additional components should be added into original circuits, taking extra space and affecting original design of the products. Thus, there is still a need to develop a novel device to overcome abovementioned problem.

SUMMARY OF THE INVENTION

The present invention provides a testkey structure and a method of using the same to measure device defect or connection defect.

According to one embodiment of the present invention, a testkey structure is provided. The testkey structure includes a fin structure, a first gate structure, a second gate structure, a first common source region, a first drain region and a second drain region. The fin structure is disposed on a substrate and stretches along a first direction. The first gate structure and the second gate structure are disposed on the fin structure and stretch along a second direction. The first common source region is disposed in the fin structure between the first gate structure and the second gate structure. The first drain region is disposed in the fin structure at a side of the first gate structure opposite to the first common source region, wherein the fin structure, the first gate structure, the first drain region and the first common source region forms a first transistor. The second drain region disposed in the fin structure at a side of the second gate structure opposite to the first common source region, wherein the fin structure, the second gate structure, the second drain region and the first common source region forms a second transistor. The testkey structure is symmetrical along a horizontal line crossing the first common source region.

According to another embodiment of the present invention, a method of measuring device defect or connection defect is provided. First, a testkey structure shown above is provided. A first current is measured by turning on the first transistor, a second current is measured by turning on the second transistor, and a common current is measured by turning on both the first transistor and the second transistor. Whether a device defect or a connection defect occurs is decided according to the first current, the second current or the common current.

Since the testkey structure is simply and is easy to operate, it can be easily designed as an array so as to gain lots of sample results by quickly scanning the array. Thus, the time for obtaining the sample result and evaluating device defect or connection defect can be greatly saved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
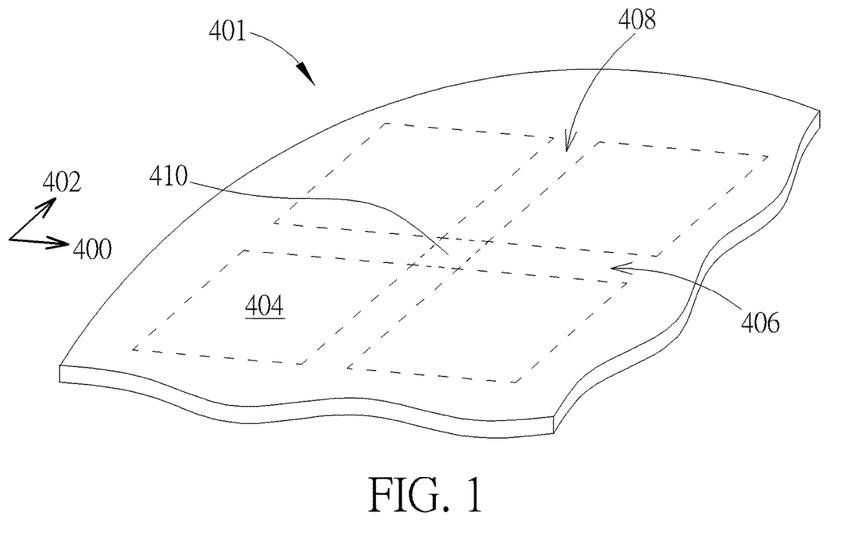
FIG. 1 shows a schematic diagram of the testkey structure on a wafer according to one embodiment of the present invention.

Please refer to FIG. 1, which show a schematic diagram of the testkey structure on a wafer according to one embodiment of the present invention. As shown in FIG. 1, a wafer 401 including a plurality of die regions 404, a plurality of first scribing line regions 406 stretching along a first direction 400 and a plurality of second scribing line regions 408 stretching along a second direction 402 are provided. In one embodiment, the first direction 400 is perpendicular to the second direction 402. Preferably, the die regions 404 are arranged in an array manner and the die regions 404 are separated from each other by the first scribe line regions 406 and the second scribe line regions 408. In the subsequent process, various semiconductor structures (not shown) such as Fin-FETs will be formed in the die regions 404 for executing logic or non-logic process, and thereafter, a dicing process will be carried out along central lines of the first scribe line regions 406 and the second scribe line regions 408 for example, to separate each dicing region 404 into a single die. A testkey structure (not explicitly shown in FIG. 1) for monitoring the accuracy of the semiconductor structures in the die region 404 is disposed in a testkey region 410. In one embodiment, the testkey region 410 is disposed in an intersection region of the first scribe line region 402 and the second scribe line region 404, as illustrated in FIG. 1. In another embodiment, the testkey region 410 can be disposed in a middle portion of the first scribe line region 406 or a middle portion of the second scribe region 408 (not shown in FIG. 1). In still another embodiment, it is also available that the testkey region 410 is disposed in the die region 404 (not shown in FIG. 1).

Figure 2:
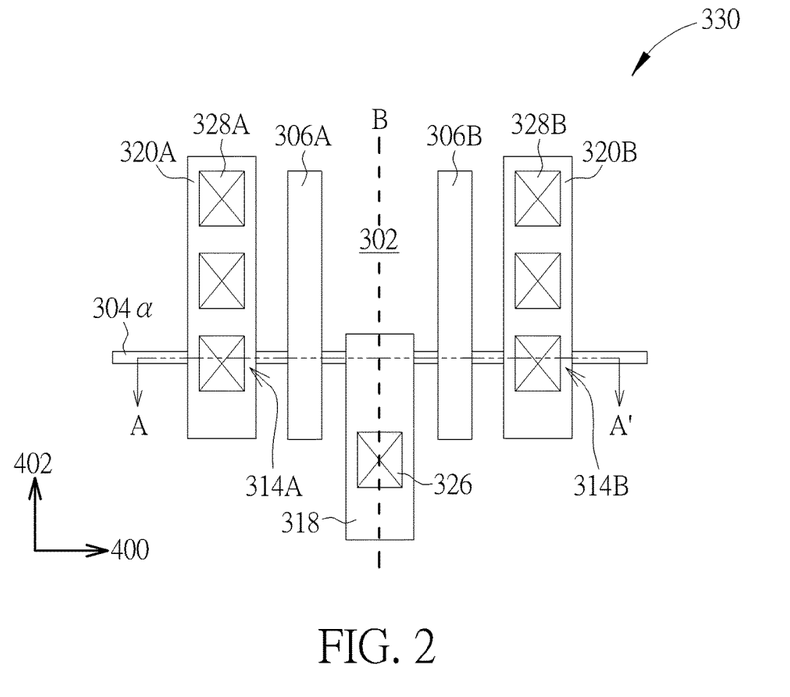
FIG. 2 and FIG. 3 show schematic diagrams of the testkey structure according to one embodiment of the present invention.
Figure 3:
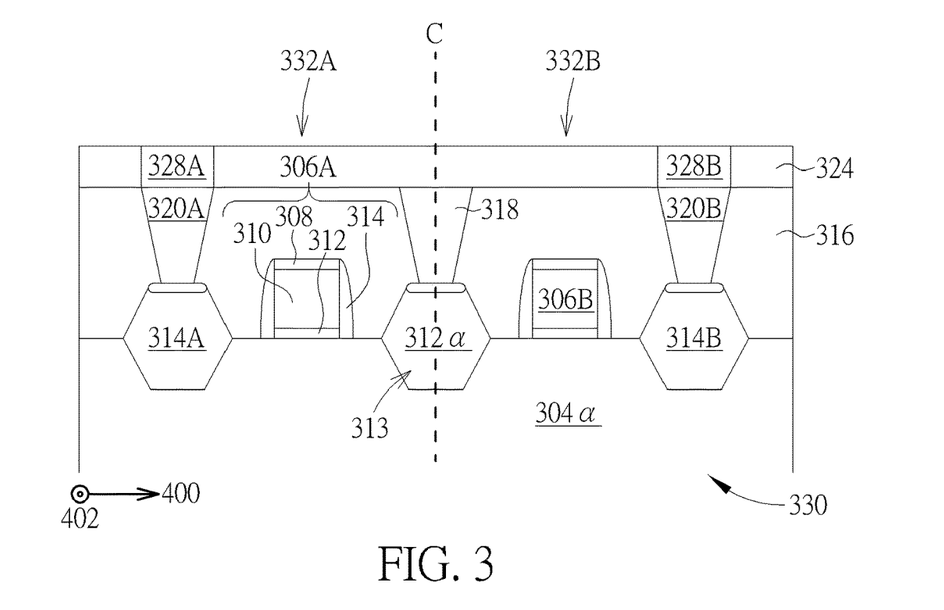

Please refer to FIG. 2 and FIG. 3, which show schematic diagrams of the testkey structure according to one embodiment of the present invention, wherein FIG. 2 shows a top view and FIG. 3 shows a cross-sectional view taken along line AA' in FIG. 2. As shown in FIG. 2 and FIG. 3, the testkey structure 330 in the present embodiment includes a substrate 300, a first fin structure 304α, a first gate structure 306A, a second gate structure 306B, a first common source region 312α, a first drain region 314A and a second drain region 314B. The substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The substrate 300 may also be composed of other semiconductor materials, such as germanium, and compound semiconductor substrates, such as type III/V semiconductor substrates, e.g., GaAs. Although the substrate 300 is depicted as a bulk semiconductor substrate, the arrangement of a semiconductor on an insulator substrate, such as silicon-on-insulator (SOI) substrates, are also suitable for the substrate 300.

The first fin structure 304α is disposed on the substrate 300 and stretches along the first direction 400. The first fin structure 304α is encompassed by an insulation structure such as a shallow trench isolation (STI) 302. The method for forming the first fin structure 304α includes, for example, forming a patterned hard mask layer (not shown) on the substrate 300, performing an etching process to from a plurality of trenches (not shown) in the substrate 300, filling an insulating material such as $SiO_2$ into the trenches, and performing a planarization and/or etching process to from said STI 302. The protruding portion of the substrate 300 above STI 302 therefore becomes the first fin structure 304α.

Thereafter, the first gate structure 306A and the second gate structure 306B are formed on the first fin structure 304α. The first gate structure 306A and the second gate structure 306B stretch along the second direction 402 and straddle over the first fin structure 304α. In one embodiment, the first gate structure 306A and the second gate structure 306B include a capping layer 308, a conductive layer 310, a gate dielectric layer 312 and a spacer 314. The capping layer 308 includes, for example, silicon nitride (SiN), silicon carbide (SiC) or silicon oxynitride (SiON). In one embodiment, the capping layer 308 may be one or multi layers composed of different dielectric materials. For example, the capping layer 310 may comprise a first capping layer (not shown) and a second capping layer (not shown), which is composed of $SiO_2$ and SiN, respectively. The conductive layer 310 can include metal or poly-silicon. The gate dielectric layer 312 includes $SiO_2$ or high-k dielectric materials, such as a material having dielectric constant greater than 4. High-k material can be are earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The spacer 314 is disposed on at least a sidewall of the capping layer 308, the conductive layer 310 and the gate dielectric layer 312. The spacer 314 can be a single layer or a composite layer, which is composed of high temperature oxide (HTO), silicon nitride, silicon oxide or silicon nitride (HCD-SiN) formed by hexachlorodisilane ($Si_2Cl_6$). In one embodiment, the spacer 314 and/or the capping layer 308 can be omitted.

The first common source region 312α is disposed in the first fin structure 304α between the first gate structure 306A and the second gate structure 308B. The first common source region 312α is formed by implanting appropriate type of dopant into the first fin structure 304α. When forming a P-type transistor, the predetermined conductivity type dopant is P type dopant, such as boron (B) and/or boron fluoride (BF). Conversely, in N-type transistor, the predetermined conductivity type dopant an N-type dopant such as arsenic (As) and/or phosphorus (P) and/or antimony (Sb), but are not limited thereto. In one embodiment, as shown in FIG. 3, the first common source region 312α is disposed in an epitaxial structure 313 with appropriate stress. The first drain region 314A is disposed in the first fin structure 304α at a side of the first gate structure 306A opposite to the first common source region 312α. The second drain region 314B is disposed in the first fin structure 304α at a side of the second gate structure 306B opposite to the first common source region 312α. The first drain region 314A and the second drain region 314B have the same type of dopant as that in the first common source region 312α. Similarly, the first drain region 314A and the second drain region 314B can be disposed in the epitaxial structures 313 if required. A silicide layer 322 such CoSi can be formed on the first common source region 312α, the first drain region 314A and the second drain region 314B.

After forming the first gate structure 306A and the second gate structure 306B, a first inter-layered dielectric (ILD) 316 is formed on the substrate 300. The first ILD 316 may include $SiO_2$, silicon dioxide formed by precursor tetraethyl orthosilicate (TEOS), plasma enhanced silicon dioxide formed by precursor etraethyl orthosilicate (PETEOS), and is not limited thereto. Trenches (not shown) in predetermined position are formed by using a patterned mask (not shown), following by filling into conductive materials to from a common slot contact 318, a first slot contact 320A and a second slot contact 320B. The common slot contact 318 electrically connects the first common source region 312α, for example, by directly contacting it (or the above silicide layer 322). The first slot contact 320A electrically connects the first drain region 314A, the second slot contact 320B electrically connects the second drain region 314B, for example, by directly contacting the first drain region 314A or the second drain region 314B (or their above silicide layer 322), respectively. In one embodiment, the common slot contact 318, the first slot contact 320A and the second slot contact 320B include titanium (Ti), titanium nitride (TiN) tantalum nitride (TaN) aluminum (Al), titanium (Ti), tantalum (Ta), tungsten (W), niobium (Nb), molybdenum (Mo), copper (Cu), and is not limited thereto.

After forming the common slot contact 318, the first slot contact 320A and the second slot contact 320B, a second ILD layer 324 is formed on the first ILD layer 316 wherein the second ILD layer 324 includes dielectric material having etching selectivity with respect to that of the first ILD layer 316. Plural holes (not shown) are formed in the second ILD layer 324 and a conductive material is filled into the holes to from a common plug 326, plural first plugs 328A and plural second plugs 328B. The common plug 326 electrically connects the common slot contact 318, for example, by directly contacting it. The first plugs 328A electrically connect the first slot contact 320A, the second plugs 328B electrically connect the second slot contact 320B, for example, by directly contacting the first slot contact 320A or the second slot contact 320B, respectively. The common plug 326, the first plugs 328A and the second plugs 328B can include conductive materials the same or different from those of the common slot contact 318, the first slot contact 320A and the second slot contact 320B.

It is one salient feature in the present invention that the testkey structure 330 is mirror symmetrical along a horizontal line B and a vertical line C, which go across the first fin structure 304α, the first common source region 312α, the common slot contact 318 and the common plug 326. The symmetricity, for example, exhibits that the length and the width of the first contact plug 320A are equal to the length and the width of the second contact plug 320B, making a project of the first contact plug 320A along the first direction 400 completely coincides with a projection of the second contact plug 320B along the first direction 400, and the so does along the second direction 404. Similar symmetrical employment can also be found in the first plugs 328A and the second plugs 328B. In addition, the number N of the first plugs 328A is the same as the number of the second plugs 328B (N=3), while the number N of the first plugs 328A is greater than the number M of the common plug 326 (M=1).

By showing the above components, a first transistor 332A and a second transistor 332B can be formed. The first transistor 332A is composed of the first fin structure 304α, the first gate structure 306A, the first drain region 314 and the first common source region 312α, and the second transistor 332B is composed of the first fin structure 304α, the second gate structure 306B, the second drain region 314B and the first common source region 312α, wherein the first transistor 332A and the second transistor 332B have the first common source region 312α as their common source.

Figure 4:
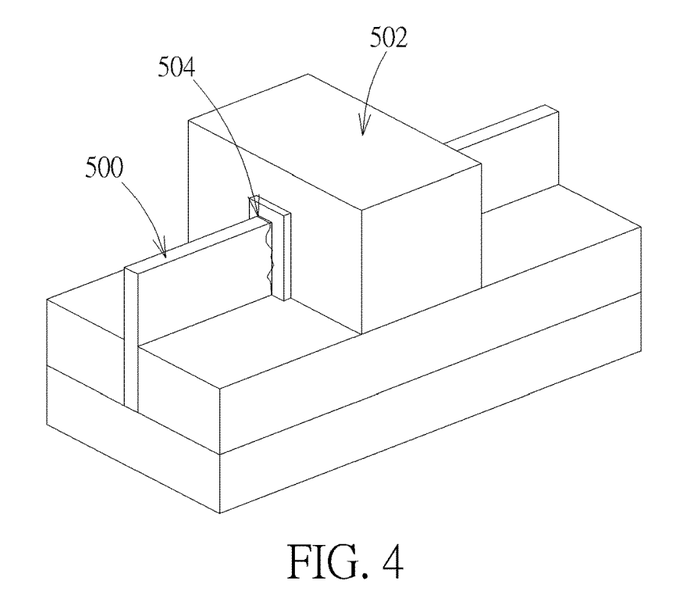
FIG. 4 shows a schematic diagram of the device defect according to one embodiment of the present invention.

The testkey structure 330 of the present invention can be fabricated simultaneously when forming logical FinFETs in the die region 404 or in a logic region (not explicitly shown) in the die region 404. Thus, the testkey structure 330 can be used to monitor the defects of the fabrication when forming the FinFETs. In one embodiment, the defects can be categorized into device defects and connection defects. The device defects, for example, refer to the defects that occur in the transistor itself. Please refer to FIG. 4, which shows a schematic diagram of the device defect according to one embodiment of the present invention. As shown in FIG. 4, a phenomenon called "device channel high resistance" is shown in the figure, which is resulted from inappropriate stress when forming the gate structure 502 on the fin structure 500. The device channel high resistance 504 would occur in the fin structure 500 beneath the interface between the fin structure 500 and the gate structure 502. Where there is a device defect such as device channel high resistance 504, the resistance value of the device would be changed, resulting also in change of the current when operating. When referring back to the embodiment in FIG. 2, if the first gate structure 306A is normal but the second gate structure 306B has "device channel high resistance", high resistance would happen at the second gate structure 306B. The current through the first transistor 332A may be different from the current through the second transistor 332B. The device defect can therefore be monitored by measuring currents through the first transistor 332A and/or the second transistor 332B.

Figure 5:
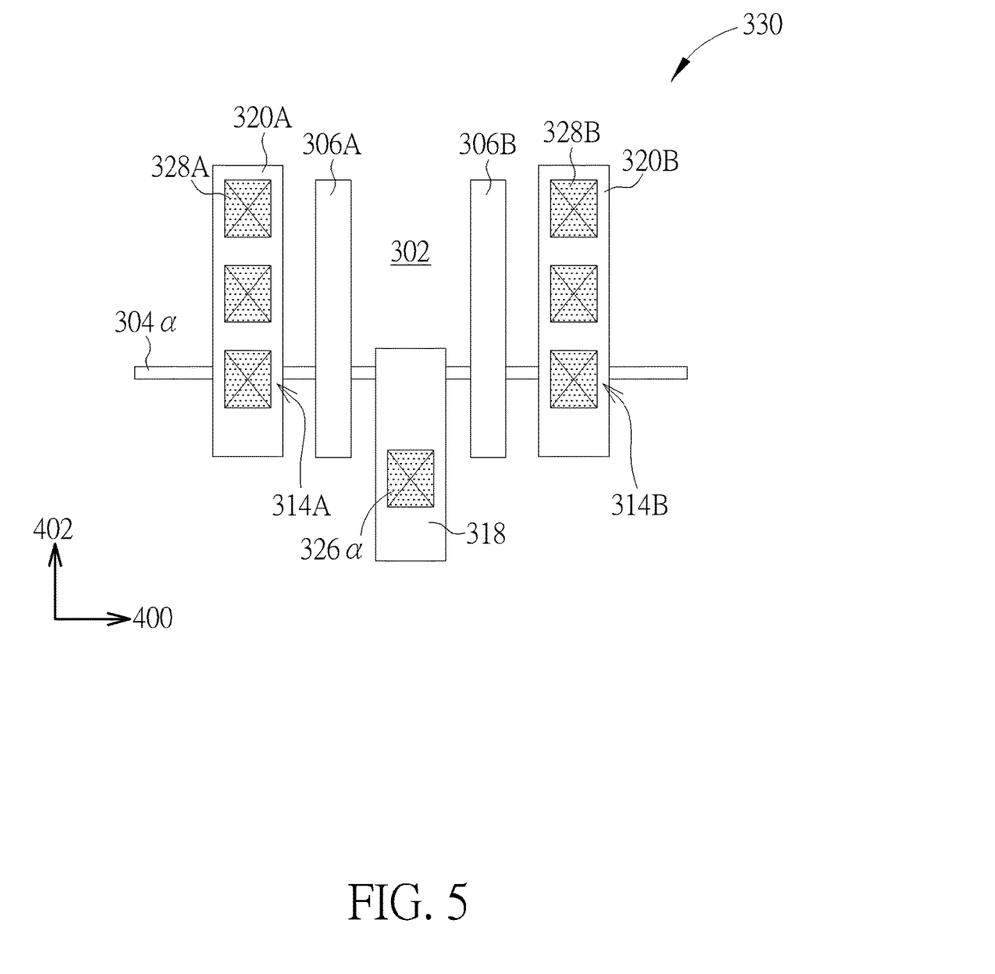
FIG. 5 shows a schematic diagram of the connection defect according to one embodiment of the present invention.

Regarding to the connection defect, it refers to the defects formed at the connection route between the devices, such as the mis-landing or poor connection of the vias or contact plugs. Please refer to FIG. 5, which shows a schematic diagram of the connection defect according to one embodiment of the present invention. As shown in FIG. 5, due to the defects during fabrication, some of the first plugs 328A, the second plugs 328B and the common plug 326α are has poor conductivity. The resistance value would be changed when operating the devices. The current, whether through the first transistor 332A or the second transistor 332B, would be changed comparing to a predetermined value. Thus, the connection defect can be monitored by measuring the current through the first transistor 332A and the second transistor 332B.

Figure 6:
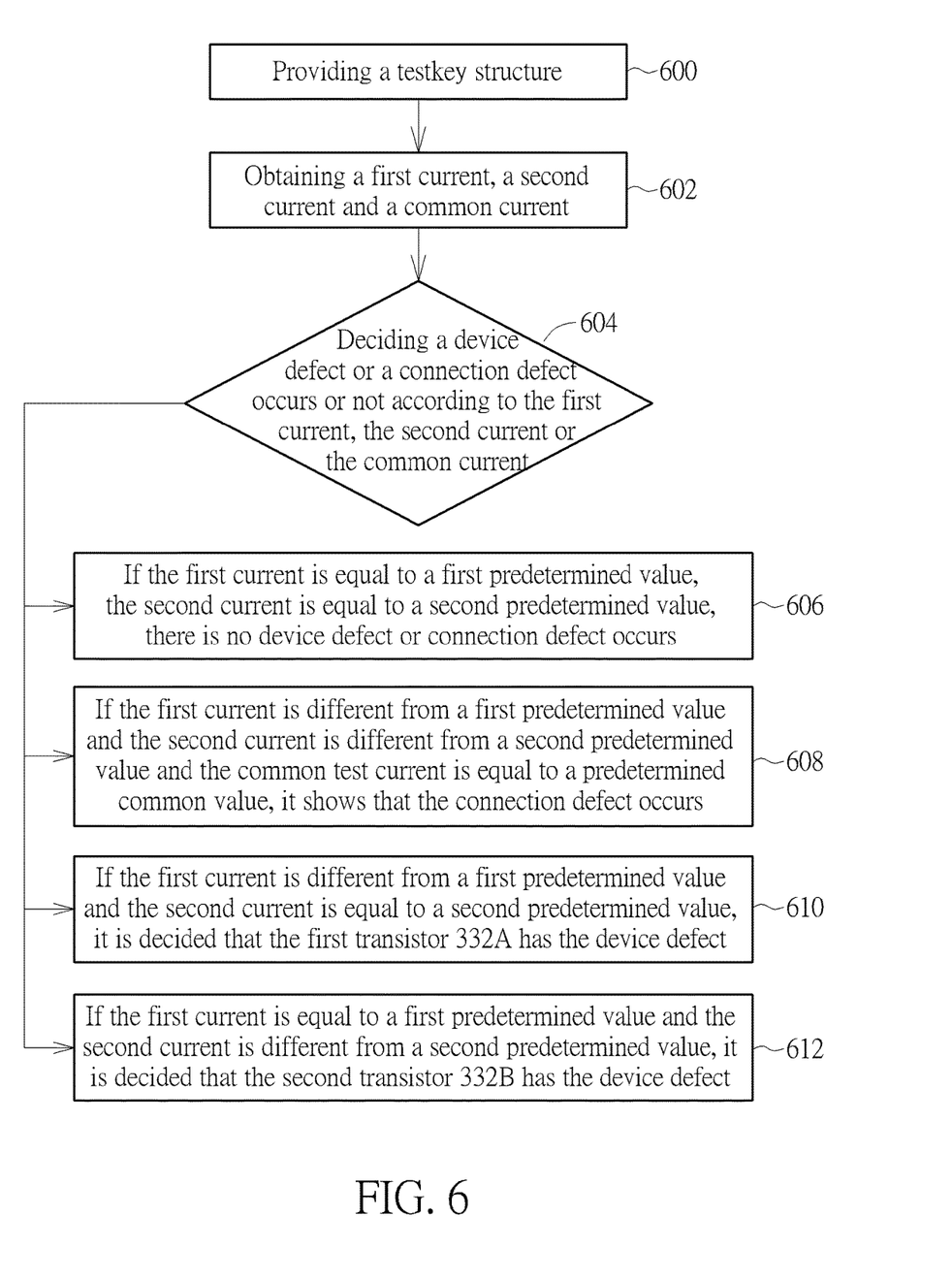
FIG. 6 shows a flow chart of the method for measuring a device defect or a connection defect according to embodiment of the present invention.

Since both the connection defect and the device defect can be monitored by the current through the first transistor 332A and/or the second transistor 332B, the testkey structure 330 in the present invention can be used to monitor if there is a device defect or a connection defect in the testkey structure 330, thereby monitoring the FinFETs in the die region 404 as well. Please refer to FIG. 6, which shows a flow chart of the method for measuring a device defect or a connection defect according to embodiment of the present invention. As shown in FIG. 5, a testkey structure as shown in FIG. 2 is provided (step 600). Next, a first current, a second current and a common current are obtained (step 602). The first current is measured by turning on the first transistor 332A, for example, by applying a first threshold voltage (Vt) to the first gate structure 308A, and applying a common voltage to the common plug 328α. The first current can be measured at the first plug 328A. The second current is measured by turning on the second transistor 332B, for example, by applying a second threshold voltage to the second gate structure 308B, and applying a common voltage to the common plug 328α. The second current can be measured at the second plug 328B. The common current is measured by turning on both the first transistor 332A and the second transistor 332B, for example, by applying a first threshold voltage to the first gate structure 308A and a second threshold voltage to the second gate structure 308B and applying a common voltage to the first plug 328A. The common current would be measured at the second plug 328B. Then, whether a device defect or a connection defect occurs or not will be decided according to the first current, the second current or the common current (step 604). If the first current is equal to a first predetermined value, the second current is equal to a second predetermined value, there is no device defect or connection defect occurs (step 606). The first predetermined value or the second predetermined value refers to the normal current value that no defect occurs. In one embodiment, the first predetermined value and the second predetermined value can be determined by measuring the first current and the second current from plural testkey structures 330 and calculating the average value therefrom. On the other hand, if the first current is different from a first predetermined value and the second current is different from a second predetermined value and the common current is equal to a predetermined common value, it shows that the connection defect occurs (step 608), especially referring to the connection defect between the common plug 326 and the contact plug 318 (It is noted that since the number N of the first plugs 328A and the second plugs 328B is greater than the number M of the common plug 326, it eliminates the possibility of defects on the connection between the first plugs 328A and the first contact plug 320A, the second plugs 328B and the second contact plug 320B). If the first current is different from a first predetermined value and the second current is equal to a second predetermined value, it is decided that the first transistor 332A has the device defect (step 610) (As discussed above, the unmatch of the first current and the first predetermined value would not result from the connect defect between the first plugs 328A and the first slot contact 320A). If the first current is equal to a first predetermined value and the second current is different from a second predetermined value, it is decided that the second transistor 332B has the device defect (step 612).

Figure 7:
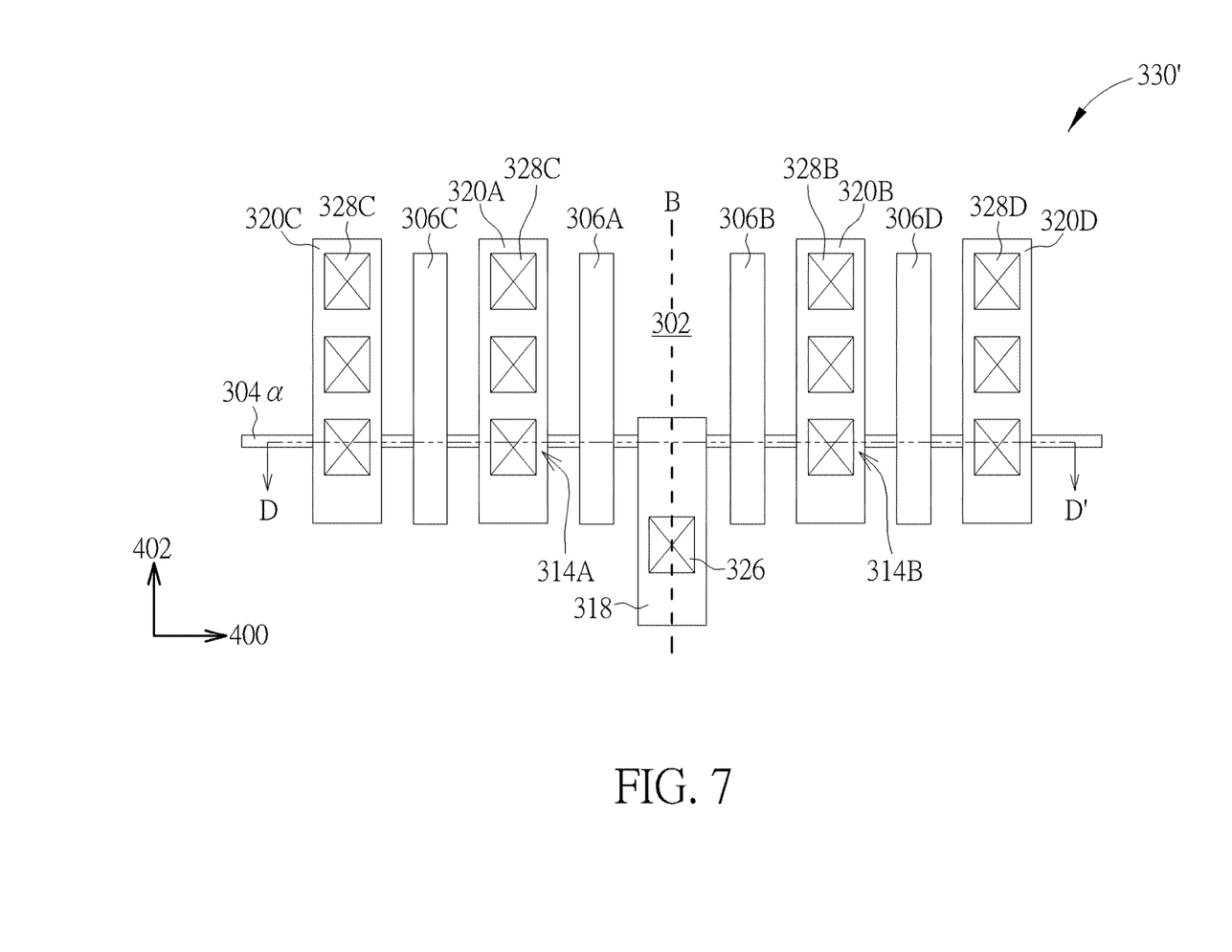
FIG. 7 and FIG. 8 show schematic diagrams of the testkey structure according to another embodiment of the present invention.
Figure 8:
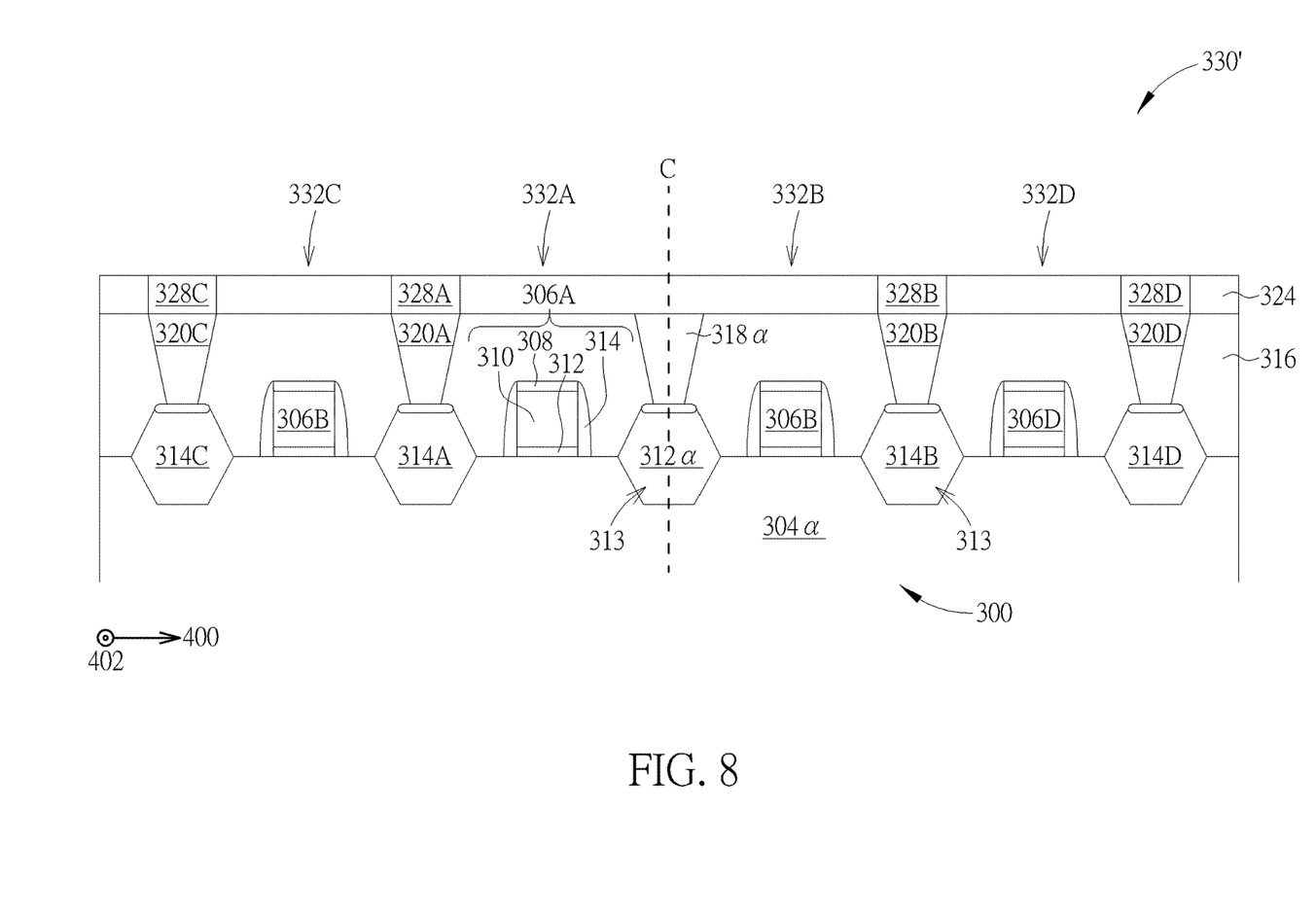

In one embodiment, the testkey structure in the present invention can be expanded along the first direction 400. Please refer to FIG. 7 and FIG. 8, which show schematic diagrams of the testkey structure according to another embodiment of the present invention, wherein FIG. 7 shows a top view and FIG. 8 shows a cross-sectional view taken along line DD' in FIG. 7. As shown in FIG. 7 and FIG. 8, comparing to the testkey structure 330 in the previous embodiment in FIG. 2, the testkey structure 330' in this embodiment further includes a third gate structure 306C, a third slot contact 320C, plural third plugs 328C, a fourth gate structure 306D, a fourth slot contact 320D and plural fourth plugs 328D. The third gate structure 306C and the fourth gate structure 306D stretch along the second direction 402. The third gate structure 306C, the first gate structure 306A, the second gate structure 306B and the fourth gate structure 306D are arranged in sequence. The components of the third gate structure 306C and the fourth gate structure 306D are similar to those of the first gate structure 306A and the second gate structure 306B, and thus are omitted for the sake of simplicity. The third drain region 314C is disposed in the first fin structure 304α at a side of the third gate structure 306C opposite to the first common source region 312α, wherein the third drain region 314C electrically connects the third slot contact 320C and the third plugs 328C. The fourth drain region 314D is disposed in the first fin structure 304α at a side of the third gate structure 306D opposite to the first common source region 312α, wherein the fourth drain region 314D electrically connects the fourth slot contact 320D and the fourth plugs 328D. The embodiments of the third drain region 314C, the third slot contact 320C and the third plug 328C are similar to the first drain region 314A, the first slot contact 320A and the firsts plug 320A, and so do the fourth drain region 314D, the fourth slot contact 320A, and the fourth plug 320D. The first fin structure 304α, the third gate structure 306C, the first drain region 314A and the third drain region 314C forms a third transistor 332C, while the first fin structure 304α, the fourth gate structure 306D, the second drain region 314B and the fourth drain region 314D forms a fourth transistor 332D. Similarly, the testkey structure 330' is mirror symmetrical along a horizontal line B and a vertical line C.

Based on the testkey structure 330', another method for measuring device defect or connection defect is further provided. First, a testkey structure 330' is provided. A third current is measured by turning on the first transistor 332A and the third transistor 332C. A fourth current is measured by turning on the second transistor 332B and the fourth transistor 332D. A second common current is measured by turning on the first transistor 332A, the second transistor 332B, the third transistor 332C and the fourth transistor 332D. It is then decided whether a device defect or a connection defect occurs or not according to the third current, the fourth current or the second common current. If the third current is equal to a third predetermined value, the fourth current is equal to a fourth predetermined value, there is no device defect or connection defect occurs. In one embodiment, the third predetermined value and the fourth predetermined value can be decided by measuring plural testkey structures 330' and calculating the average value therefrom. If the third current is different from the third predetermined value, the fourth current is different from the fourth predetermined value, and the second common current is the same as a second common predetermined value, it is decided that the connection defect occurs. If the third current is different from the third predetermined value, the fourth current is the same as the fourth predetermined value, it is decided that the first transistor 332A or the third transistor 332C has the device defect. If the third current is the same as the third predetermined value, the fourth current is different from the fourth predetermined value, it is decided that the second transistor 332B or the fourth transistor 332D has the device defect.

Figure 9:
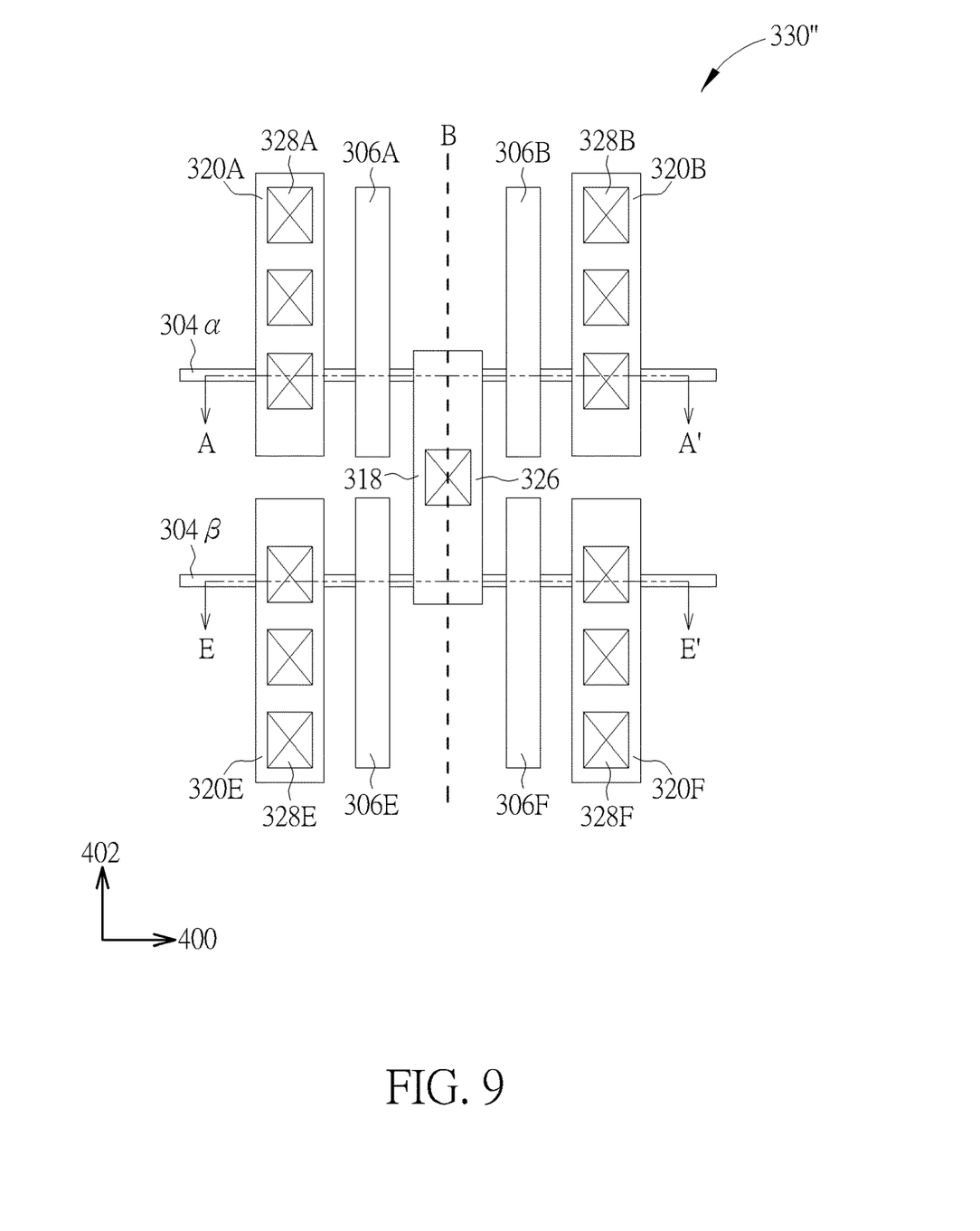
FIG. 9 and FIG. 10 show schematic diagrams of the testkey structure according to another embodiment of the present invention.
Figure 10:
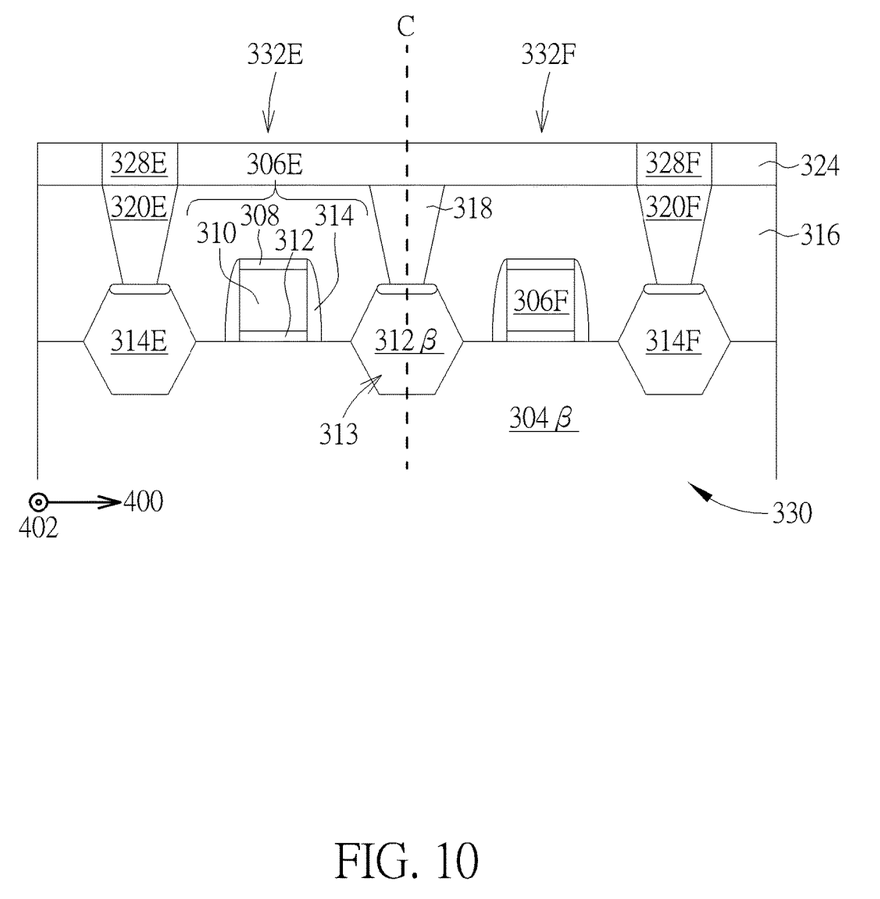

In one embodiment, the testkey structure in the present invention can be expanded along the second direction 402. Please refer to FIG. 9, FIG. 10 and FIG. 3, which show schematic diagrams of the testkey structure according to another embodiment of the present invention, wherein FIG. 9 shows a top view, FIG. 10 shows a cross-sectional view taken along line EE' in FIG. 9, and FIG. 3 shows a cross-sectional view taken along line AA' in FIG. 9. As shown in FIG. 9 and FIG. 10, comparing to the testkey structure 330 in the previous embodiment in FIG. 2, the testkey structure 330'' in this embodiment further includes a second fin structure 304β, a fifth gate structure 306E, a fifth slot contact 320E, plural fifth plugs 328E, a sixth gate structure 306F, a sixth slot contact 320F and plural sixth plugs 328F. The second fin structure 304β is disposed on the substrate 300 and stretch along the first direction 400. The fifth gate structure 306E and the fourth gate structure 306F are disposed on the second fin structure 304β and stretch along the second direction 402. The second common source region 312β is disposed in the second fin structure 312β between the fifth gate structure 306E and the sixth gate structure 306F. The common slot contact 318 contacts the second common source region 312β, thereby electrically connecting the first common source region 312α and the second common source region 312β. The fifth drain region 314E is disposed in the second fin structure 304β at a side of the fifth gate structure 306E opposite to the second common source region 312β and is electrically connected to the fifth slot contact 320E and the fifth plugs 328E. The sixth drain region 314F is disposed in the second fin structure 304β at a side of the sixth gate structure 306F opposite to the second common source region 312β and is electrically connected to the sixth slot contact 320F and the sixth plug 328F. The embodiments of the fifth drain region 314E, the fifth slot contact 320E and the fifth plug 328E are similar to the first drain region 314A, the first slot contact 320A and the first plug 320A, and so do the sixth drain region 314F, the sixth slot contact 320F, and the sixth plug 320F. The second fin structure 304β, the fifth gate structure 306E, the second common source region 312β and the fifth drain region 314E forms a fifth transistor 332E, while the second fin structure 304β, the sixth gate structure 306F, the second common source region 312β and the sixth drain region 314F forms a sixth transistor 332F. Similarly, the testkey structure 330" is mirror symmetrical along a horizontal line B and a vertical line C.

Based on the testkey structure 330", another method for measuring device defect or connection defect is further provided. First, a testkey structure 330" is provided. A first current is measured by turning on the first transistor 332A, and a second current is measured by turning on the second transistor 332B. A fifth current is measured by turning on the fifth transistor 332E, and a sixth current is measured by turning on the sixth transistor 332F. A first common current is measured by turning on the first transistor 332A and the second transistor 332B with turning off the fifth transistor 332E and the sixth transistor 332F. A second common current is measured by turning on both the fifth transistor 332E and the sixth transistor 332F with turning off the first transistor 332A and the second transistor 332B. It is then decided whether a device defect or a connection defect occurs according to the first current, the second current, the fifth current, the sixth current, the first common current or the third common current. If the first common current is the same as a first predetermined common value and the second common current is the same as a second predetermined common value, but the first current, the second current, the fifth current and the sixth current are not equal to the first predetermined value, the second predetermined value, the third predetermined value, the fourth predetermined value, it is determined that the connection defects occurs. If there is no connection defects issue, then the device defect issue is individually checked based on the first current v.s. first predetermined value, the second current v.s. the second predetermined current, the third current v.s. the third predetermined value, and the fourth current v.s. the fourth predetermined value, which is similar to the method shown in FIG. 6.

It is understood that, based on the same principle, the testkey structure can be extended further along the first direction 400 (as the embodiment in FIG. 7 and FIG. 8) and/or along the second direction 402 (as the embodiment in FIG. 9 and FIG. 10).

In summary, the present invention provides a testkey structure and a method of measuring device defect or connection defect by using said testkey structure. Since the testkey structure is simply and is easy to operate, it can be easily designed as an array so as to gain lots of sample results by quickly scanning the array. Thus, the time for obtaining the sample result and evaluating device defect or connection defect can be greatly saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testkey structure, comprising:
   a fin structure disposed on a substrate, stretching along a first direction;
   a first gate structure and a second gate structure disposed on the fin structure, stretching along a second direction;
   a first common source region disposed in the fin structure between the first gate structure and the second gate structure;
   a first drain region disposed in the fin structure at a side of the first gate structure opposite to the first common source region, wherein the fin structure, the first gate structure, the first drain region and the first common source region forms a first transistor; and
   a second drain region disposed in the fin structure at a side of the second gate structure opposite to the first common source region, wherein the fin structure, the second gate structure, the second drain region and the first common source region forms a second transistor, and the testkey structure is symmetrical along a horizontal line crossing the first common source region;
   a common slot contact connecting the first common source region;
   a common plug connecting the common slot contact;
   a first slot contact connecting the first drain region;
   at least one first plug connecting the first slot contact;
   a second slot contact connecting the second drain region; and
   at least one second plug connecting the second slot contact.

2. The testkey structure according to claim 1, wherein the horizontal line is parallel to the second direction.

3. The testkey structure according to claim 1, wherein the testkey structure is symmetrical along a vertical line crossing the first common source region.

4. The testkey structure according to claim 1, wherein a number of the first plug is equal to a number of the second plug.

5. The testkey structure according to claim 4, wherein a number of the first plug is greater than a number of the common plug.

6. The testkey structure according to claim 1, further comprising:
   a third gate structure and a fourth gate structure disposed on the fin structure, stretching along the second direction, wherein the third gate structure, the first gate structure, the second gate structure and the fourth gate structure are arranged in sequence;
   a third drain region disposed in the fin structure at a side of the third gate structure opposite to the first common source region, wherein the fin structure, the third gate structure, the first drain region and the third drain region forms a third transistor; and
   a fourth drain region disposed in the fin structure at a side of the fourth gate structure opposite to the first common source region, wherein the fin structure, the fourth gate structure, the second drain region and the fourth drain region forms a fourth transistor.

7. The testkey structure according to claim 6, further comprising:
   a third slot contact connecting the third drain region;
   at least one third plug connecting the third slot contact;
   a fourth slot contact connecting the fourth drain region; and
   at least one fourth plug connecting the fourth slot contact.

8. The testkey structure according to claim 1, further comprising:
  a second fin structure disposed on a substrate, stretching along the first direction;
  a fifth gate structure and a sixth gate structure disposed on the second fin structure, stretching along the second direction;
  a second common source region disposed in the second fin structure between the fifth gate structure and the sixth gate structure, wherein the second common source region is electrically connected to the first common source region;
  a fifth drain region disposed in the second fin structure at a side of the fifth gate structure opposite to the second common source region, wherein the second fin structure, the fifth gate structure, the fifth drain region and the second common source region forms a fifth transistor; and
  a sixth drain region disposed in the second fin structure at a side of the sixth gate structure opposite to the second common source region, wherein the second fin structure, the sixth gate structure, the sixth drain region and the second common source region forms a sixth transistor.

9. The testkey structure according to claim 8, further comprising:
  a common slot contact connecting the first common source region and the second common source region;
  a common plug connecting the common slot contact;
  a fifth slot contact connecting the fifth drain region;
  at least one fifth plug connecting the fifth slot contact;
  a sixth slot contact connecting the sixth drain region; and
  at least one sixth plug connecting the sixth slot contact.

10. A method of measuring device defect or connection defect, comprising:
  providing a testkey structure according to claim 1;
  measuring a first current by turning on the first transistor;
  measuring a second current by turning on the second transistor;
  measuring a common current by turning on both the first transistor and the second transistor; and
  deciding whether a device defect or a connection defect occurs according to the first current, the second current or the common current.

11. The method of measuring device defect or connection defect according to claim 10, wherein if the first current is different from a first predetermined value, the second current is different from a second predetermined value, and the common current is equal to a predetermined common value, it is decided that the connection defect occurs.

12. The method of measuring device defect or connection defect according to claim 10, wherein if the first current is different from a first predetermined value and the second current is different from a second predetermined value, it is decided that the first transistor has the device defect.

13. The method of measuring device defect or connection defect according to claim 10, wherein if the first current is equal to a first predetermined value and the second current is different from a second predetermined value, it is decided that the second transistor has the device defect.

14. The method of measuring device defect or connection defect according to claim 10, wherein the testkey structure further comprises:
  a third gate structure and a fourth gate structure disposed on the fin structure, stretching along the second direction, wherein the third gate structure, the first gate structure, the second gate structure and the fourth gate structure are arranged in sequence;
  a third drain region disposed in the fin structure at a side of the third gate structure opposite to the first common source region, wherein the fin structure, the third gate structure, the first drain region and the third drain region forms a third transistor; and
  a fourth drain region disposed in the fin structure at a side of the fourth gate structure opposite to the first common source region, wherein the fin structure, the fourth gate structure, the second drain region and the fourth drain region forms a fourth transistor, and the method further comprises:
  measuring a third current by turning on the first transistor and the third transistor;
  measuring a fourth current by turning on the second transistor and the fourth transistor; and
  measuring a second common current by turning on the first transistor, the second transistor, the third transistor and the fourth transistor.

15. The method of measuring device defect or connection defect according to claim 14, wherein if the third current is different from a third predetermined value, the fourth current is different from a fourth predetermined value, and the second common current is equal to a second common predetermined value, it is decided that the connection defect occurs.

16. The method of measuring device defect or connection defect according to claim 14, wherein if the third current is different from a third predetermined value, the fourth current is equal to a fourth predetermined value, it is decided that the first transistor or the third transistor has the device defect.

17. The method of measuring device defect or connection defect according to claim 14, wherein if the third current is equal to a third predetermined value, the fourth current is different from a fourth predetermined value, it is decided that the second transistor or the fourth transistor has the device defect.

18. The method of measuring device defect or connection defect according to claim 10, wherein the testkey structure further comprises:
  a second fin structure disposed on a substrate, stretching along the first direction;
  a fifth gate structure and a sixth gate structure disposed on the second fin structure, stretching along the second direction;
  a second common source region disposed in the second fin structure between the fifth gate structure and the sixth gate structure, wherein the second common source region is electrically connected to the first common source region;
  a fifth drain region disposed in the second fin structure at a side of the fifth gate structure opposite to the second common source region, wherein the second fin structure, the fifth gate structure, the fifth drain region and the second common source region forms a fifth transistor; and
  a sixth drain region disposed in the second fin structure at a side of the sixth gate structure opposite to the second common source region, wherein the second fin structure, the sixth gate structure, the sixth drain region and the second common source region forms a sixth transistor, and the method further comprises:
  measuring a fifth current by turning on the fifth transistor;
  measuring a sixth current by turning on the sixth transistor; and measuring a second common current by turning on both the fifth transistor and the sixth transistor.

19. The method of measuring device defect or connection defect according to claim 18, wherein if the first current is different from a first predetermined value, the second current is different from a second predetermined value, the fifth current is different from a fifth predetermined value, the sixth current is different from a sixth predetermined value, the common current is equal to a predetermined common value, and the second common current is equal to a second predetermined common value, it is decided that the connection defect occurs.

* * * * *